(12) United States Patent
Baumgartner et al.

(10) Patent No.: US 8,122,403 B2
(45) Date of Patent: Feb. 21, 2012

(54) TRACE CONTAINMENT DETECTION OF COMBINATIONAL DESIGNS VIA CONSTRAINT-BASED UNCORRELATED EQUIVALENCE CHECKING

(75) Inventors: Jason R. Baumgartner, Austin, TX (US); Robert L. Kanzelman, Rochester, MN (US); Hari Mony, Austin, TX (US); Viresh Paruthi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 306 days.

(21) Appl. No.: 12/425,095

(22) Filed: Apr. 16, 2009

(65) Prior Publication Data

US 2010/0269077 A1   Oct. 21, 2010

(51) Int. Cl.
 *G06F 9/455* (2006.01)
 *G06F 17/50* (2006.01)
(52) U.S. Cl. ........ 716/107; 716/106; 716/111; 716/132; 716/134; 716/135; 703/2

(58) Field of Classification Search .................. 716/106, 716/107, 111, 132–136; 703/2
See application file for complete search history.

(56) References Cited

U.S. PATENT DOCUMENTS

| | | | |
|---|---|---|---|
| 6,567,959 B2 | 5/2003 | Levin et al. | |
| 2004/0098683 A1* | 5/2004 | Maruyama et al. | 716/5 |
| 2006/0190873 A1 | 8/2006 | Baumgartner et al. | |
| 2006/0248494 A1 | 11/2006 | Baumgartner et al. | |
| 2007/0033552 A1* | 2/2007 | Li | 716/4 |
| 2007/0271534 A1 | 11/2007 | Paruthi et al. | |

* cited by examiner

*Primary Examiner* — Thuan Do
*Assistant Examiner* — Nha Nguyen
(74) *Attorney, Agent, or Firm* — Brevetto Law Group (57) ABSTRACT

Methods and systems are provided for producing more efficient digital circuitry designs by identifying trace-containment for a sequential circuitry design netlist through the use of constraint-based uncorrelated equivalence checking. A set of candidate input netlist sets n1 and n2 is first uncorrelated and then submitted for equivalence checking. Mismatches discovered during the equivalence checking are avoided by imposing constraint to the input set until discovering an equivalency relationship between the input sets n1 and n2.

19 Claims, 4 Drawing Sheets

TRACE CONTAINMENT DETECTION OF COMBINATIONAL DESIGNS VIA CONSTRAINT-BASED UNCORRELATED EQUIVALENCE CHECKING

CROSS-REFERENCE TO RELATED APPLICATIONS

The present application is related to, and incorporates by reference in its entirety, U.S. patent application Ser. No. 12/392,278.

BACKGROUND

1. Field of the Invention

The present invention relates to digital circuitry designs of state machines, and more specifically, to systems, methods and computer products for improving the efficiency of digital circuitry designs.

2. Description of Related Art

An electrical circuit with memory elements may be modeled using state equations and state variables to describe the behavior and state of the system. A complete set of state variables for a system, coupled with logic that defines the transitions between states, typically contains enough information about the system's history to enable computation of the system's future behavior. Simplifying the model to reduce the number of state variables, or simplifying the logic that defines state transitions, lessens the computational cost of analyzing the model, for example, to verify that it conforms to a given specification.

The synthesis and verification of state variable models often requires a great deal of computational resources. Hence, the ability to reduce design size is of central importance to a variety of tasks in logic design since verification algorithms often require exponential resources with respect to design size. The ability to reduce design size may make the difference in whether or not it is feasible to use a verification algorithm to expose a design flaw.

What is needed is an improved system for reducing digital circuitry design size.

SUMMARY

Embodiments disclosed herein address the above stated needs by providing systems, methods and computer products for identifying trace-containment for a sequential circuitry design netlist through the use of constraint-based uncorrelated equivalence checking. In various embodiments this is done by obtaining candidate input sets n1 and n2, uncorrelating the input set n1 from the input set n2, checking equivalence of the input sets n1 and n2 to identify trace-containment, identifying a mismatch between the input set n1 and the input set n2, and imposing at least one constraint to avoid the identified mismatch.

Other embodiments validate a relationship of equivalence of the input sets n1 and n2, and produce a simplified version of the sequential circuitry design netlist, wherein the relationship is validated after imposing at least one constraint, and wherein the imposed constraint avoids the identified mismatch by artificially limiting the stimulus that can be applied. Other embodiments and variations are described in this disclosure.

BRIEF DESCRIPTION OF THE DRAWINGS

The accompanying drawings, which are incorporated in and constitute part of the specification, illustrate various embodiments of the invention. Together with the general description, the drawings serve to explain the principles of the invention. In the drawings.

DETAILED DESCRIPTION

Various embodiments of the present application involve improved techniques of trace-equivalence detection. "Trace-equivalence" refers to the condition that any sequence of output behavior producible by one design is also producible by another. The term "trace-containment" refers to the condition that the traces producible by one design are a subset of those producible by another. These conditions generalize behavioral or functional equivalence, which refers to the condition that two designs produce the same sequence of output behavior under the same input sequence. It should be noted that trace-equivalence does not necessarily require identical behavior under the same input sequence. Hence, input values may be manipulated across the two designs to yield identical output behavior, and for that matter, the inputs of two trace-equivalent designs need not be I-to-1.

Trace-equivalence and trace-containment detection have numerous applications in logic design and verification. For example, one may seek to reduce the size of a design to enhance verification by attempting to replace a component of that design by a component which behaves in a trace-equivalent manner, yet requires less logic. Trace-containment based reduction tends to offer greater theoretical potential for reducing design size than traditional techniques used in synthesis and verification which attempt to reduce a design yet preserve its overall behavior, since such traditional techniques do preserve trace-equivalence and, additionally, a much larger variety of transformations preserve trace-equivalence but not behavioral equivalence. Another example application of trace-equivalence detection in synthesis is to assess whether one design component may be used to implement the functionality of another. Despite the greater flexibility and reduction potential possible using trace-equivalence based techniques, such techniques have not seen significant usage to date because they are computationally very expensive, and no good heuristics have been developed to perform such reductions in a scalable manner, possibly trading optimality for run-time. Various embodiments disclosed herein involve a heuristic framework for proving that one netlist trace contains another.

A netlist can be used to represent a circuitry design. One of the preliminary activities in constraint-based uncorrelated equivalence checking is to define the netlist(s) to be used, and to define any introductory terms or conditions. Typically, a circuit design netlist contains a directed graph with vertices representing gates, and edges representing interconnections between those gates. The gates have associated functions such as constants, primary inputs, combinational logic such as AND gates, and sequential elements (state devices) sometimes referred to as registers. Registers have two types of associated functions: their next-state functions, and their initial-value functions. Both may be represented as gates in the netlist graph. Semantically, for a given register, the value appearing at its initial-value gate at time "0" ("initialization"

or "reset" time) will be applied as the value of the register itself. The value appearing at its next-state function gate at time "i" will be applied to the register itself at time 'i+1'. A netlist with no registers represents combinational logic. Certain gates in a netlist may be labeled as "targets." Targets correlate to the properties sought to be verified. One goal of the verification process is to find a way to drive a "1" to a target node—and to generate a "trace" of valuations to gates over time illustrating this scenario if one is found—or else to prove that no such assertion of the target is possible. "Constraints" are used to artificially limit the stimulus that can be applied to the inputs of the design. In particular, when searching for a way to drive a "1" to a target, the verification process typically adheres to the rule that every constraint gate must evaluate to a logical 1 for every time-step up to, and including, the time-step at which the target is asserted. The term "cofactor" refers to replacing an input in a design by a constant. A positive cofactor refers to replacing the input by constant 1. A negative cofactor refers to replacing the input by constant 0. A netlist may be simplified by the "merge" operation which replaces fanout references from one gate with references to the gate that it is being merged onto. A "cut" refers to a partitioning of a netlist graph into two components.

Figure 1:
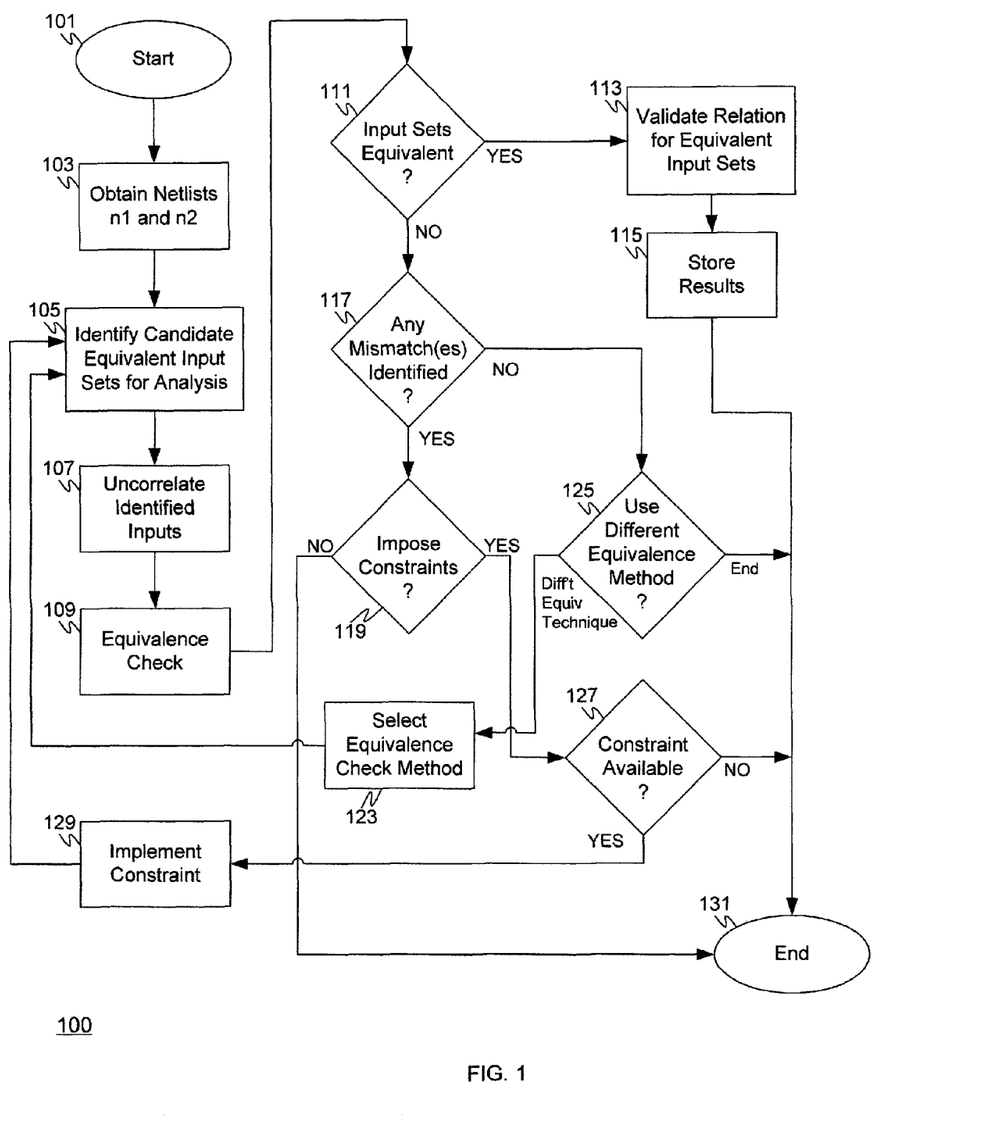
FIG. 1 is a flowchart depicting techniques for developing relationships between two netlist traces according to various embodiments of the invention.

FIG. 1 is a flowchart depicting techniques for developing relationships between two netlist traces. The method seeks to prove that one netlist trace contains another netlist trace according to various embodiments of the invention by identifying a relation between the two netlists. The relation is built through enumerating mismatches and adding constraints to preclude the mismatching scenarios. Once this relation is complete, our technique next efficiently enumerates a set of checks to ensure that the constraints do not preclude exploring any input valuations in n1 to ensure overall soundness, namely, that n2 can produce the same set of traces as n1.

The method begins at 101 and proceeds to 103 where two netlists n1 and n2 are received or otherwise obtained for analysis. The two netlists may be an original circuitry design netlist and a proposed simplified version of the original netlist, or may be different portions (overlapping or non-overlapping) of the same circuitry design thought to perhaps be redundant. Once netlists n1 and n2 are available in 103 the method proceeds to 105. In block 105 a subset of inputs for n1 is identified that may be manipulated to force n1 to produce identical behavior to n2. Note that the subset of inputs may, in some situations, include all inputs. Once the input subsets are identified the method proceeds to 107 to uncorrelate the selected input sets. Uncorrelating the inputs enables them to be independently manipulated.

Block 107 involves determining the inputs to be uncorrelated for analysis across two or more equivalence checks. One straight-forward implementation would be to uncorrelate all inputs, eventually adding constraints between the simplified and original netlist to enforce those which must be equivalent across both designs to be so. However, such an implementation with all the inputs being uncorrected may entail burdensome computational overhead. Instead, it is more efficient for inputs that are correlated across both designs to be merged as with traditional equivalence checking, thus reducing the difficulty and computational burden of the overall equivalence check. For efficiency, it is ideal to uncorrelate as few inputs as possible. Various embodiments identify a minimally-sized set of inputs to uncorrelate through analysis of traces that witness mismatches across the two copies of the design. In particular, we wish to assess a minimal set of inputs which may cause the mismatch across the two designs witnessed by a particular trace. Minimization of input assignments in traces can be performed in a variety of ways. For example, circuit-based SAT solvers can be used to naturally produce minimal-assignment traces, and such traces may be produced through a failed equivalence check; e.g. produced from a prior iteration through block 109. Once the inputs to uncorrected have been determined in 107, the method proceeds to 109.

In block 109 an equivalence check is performed. This is done while attempting to form a relation, through constraints, across the uncorrelated inputs of the designs being equivalence checked. The method proceeds to 111 to evaluate whether the equivalence check passed. In response to determining in 111 that the equivalence check passed, the method proceeds from 111 along the YES branch to 113 to validate the relation between the uncorrelated input sets. (In the event the equivalence check fails the method proceeds along the NO path from 111 to 117, as discussed below.)

Block 113 validates that the trace-containment detection is accurate because there is a risk that the trace-equivalence mechanism may become unsound—that is, report a trace-containment result across two designs which really does not satisfy that relation. There is a risk that the addition of constraints in carrying out the method of constraint-based uncorrelated equivalence checking may become contradictory for some input vectors, and thus that the constraints may not truly cover all inputs. Consider a situation in which n1 and n2 are not trace equivalent. This means that there exists a set of mismatch traces over these two netlists with overlapping "v1" terms representing valuations to the uncorrelated inputs in n1, for which the "v2" terms representing valuations to the uncorrelated inputs in n2 is a contradiction. For example, consider a simple example where there is one uncorrelated input across the designs. One mismatch trace may preclude the uncorrelated input of n1 from taking value 1 when the uncorrelated input of n2 takes value 1, then another mismatch trace may preclude the uncorrelated input of n' from taking value 1 when the uncorrelated input of n2 takes value 0. The constraints will thus prevent the uncorrelated input of n1 from taking value 1 whatsoever, since no value of the uncorrelated input of n2 will satisfy the constraints. Thus, in this instance the trace-containment process will truly not check that every valuation to n1's inputs are covered by some behavior of the original netlist, risking incompleteness of the case splitting inherent with the constraints.

Various embodiments for validating the relation in block 113 correct for this risk by checking that every set of valuations over the uncorrelated n1 inputs are truly reachable despite the added constraints. If so, then n1 can cover the behavior of netlist n2. Otherwise, if a valuation is found to not be reachable given the constraints, we instead invert the direction of the added constraints: instead of being of the form "v1 implies that v2 cannot occur", where v1 is over n1 and v2 is over n2, the constraint will be configured in the form "v2 implies that v1 cannot occur." If the corresponding set of constraints allows for all inputs of n2 to be reachable, that means that n2 covers the behavior of n1.

Computational efficiency is another factor to consider in the block 113 routine for validating the relation. For overall efficiency, since there may be many uncorrelated inputs and enumerating the reachability of all valuations to those inputs may be costly in terms of computational resources, this check may be simplified by only validating all consistent cross-products of "implies" terms obtained from the mismatch traces. For example, if we obtained three implies terms for v1 over uncorrelated inputs i1, i2, i3, which show (i1=0, i2=0); (i3=1); and (i2=0, i3=0), then we need only enumerate the consistent cross-products over these three terms. Since i3=1 and i3=0 are contradictory, we need only couple the (i1=0, i2=0) and (i3=1) terms. In this way the (i1=0, i2=0) and (i2=0, i3=0) terms can be validated in only two checks instead of requiring $2^3=8$ checks.

Returning to block 113, once the relation is validated in 113 the method proceeds to 115. The valid relation is stored in 115 in a format suitable for use in producing a simplified version of the original sequential circuitry design. This may be done by using an input remapping filter to replace portions of the circuitry with simplified, equivalent portions. Upon completing block 115 the method proceeds to 131 where it ends. Returning to block 111, if it is determined that the equivalence check of n1 and n2 failed then the method makes adjustments in an attempt to form a valid relationship over the uncorrelated inputs, such that a subsequent equivalence check may pass, by proceeding from 111 along the NO branch to 117. In block 117 an attempt is made to identify the mismatch giving rise to the non-equivalency. If, in block 117, the mismatch is properly identified the method proceeds from 117 via the YES branch to 119 to determine whether or not to impose constraints in an effort to avoid the mismatch. Applying one or more constraints allows us to artificially limit the stimulus that can be applied to the inputs of the design, thus avoiding the mismatch and increasing the chance of a passing equivalence check (in block 109) in a subsequent iteration. If it is determined in 119 to impose constraints the method proceeds from 119 along the YES branch to 127. Block 127 determines whether there is a constraint applicable for use in the given situation. If there is a constraint available the method proceeds from 127 along the YES branch to 129 to implement the constraint, and then onto 105 to make adjustments to input sets for possible uncorrelation in netlists n1 and n2 before again checking for equivalence. However, if it is determined in 127 that there is no constraint available the method proceeds from 127 along the NO branch to 131 and ends. Returning to block 119, if it is determined not to impose constraints the method proceeds from 119 along the NO branch to 131 where the method ends. Returning to block 117, in the event the mismatch cannot be identified the method proceeds from 117 via the NO branch to 125 to determine how to proceed. If no further efforts are to be taken the method proceeds from 125 along the END branch to 131 where the method ends.

In accordance with various embodiments the constraints are automatically determined over the uncorrelated inputs. This, in turn, allows equivalence checking to detect trace containment. Once the inputs to uncorrelated have been identified, in some instances even more mismatch potential is opened up across the two netlists since uncorrelation can even cause two functionally equivalent netlists to appear inequivalent. Mismatch traces may be used between these two netlists to construct the constraints which implement the case splitting process. For example, when we see a mismatch trace that has a particular valuation v1 to the uncorrelated inputs in n1 and has valuation v2 to the uncorrelated inputs in n2, we may constrain that "v1 implies that v2 cannot occur," and check for an additional mismatch. By iterating the process of obtaining a mismatch, adding a constraint, and repeating until a fixed point is reached, we may build the necessary constraining relationship.

The constraint identification process in 127 is often performed through analysis of a trace illustrating the cause of a failed equivalence check from 109. In particular, one may identify within such a trace what valuations were observed to the uncorrelated inputs, and those valuations may be used as the basis of the constraint to be added to preclude the cause of the failed equivalence check witnessed by the generated trace. It should be further noted that, if using a procedure which generates minimal assignments in its traces (e.g., those obtained during the failed equivalence check), each constraint can limit a large number of mismatch scenarios. For example, consider the one-hot example above in FIG. 2A. If any one-hot vector is driven to the uncorrelated inputs of the simplified design, and anything other than all zeros are driven to the original design with I0 driven to 1, we will see a mismatch at the "1hot?" gate. Assuming, in this example, there are three uncorrelated inputs in this vector, the one-hot values are "001" "010" and "100." Our first mismatch scenario may show "001" on the simplified inputs and "1--" on the original inputs (where "-" means "unassigned"). After constraining this scenario, we may obtain "001" vs. "-1-"; then "001" vs. "--1." Next we may obtain "010" vs. "1--"; "010" vs. "-1-"; then "010" vs. "--1." Finally, we obtain "100" vs. "1--"; then "100" vs. "-1-"; then "100" vs. "--1." After this final ninth constraint no more mismatch traces will be produced. However, if using fully assigned traces and constraining with all inputs assigned, we may have 26 mismatch traces since there are 3+3=6 uncorrelated inputs across all designs (or 2^6 where "^" denotes exponentiation).

Returning to block 127, if such a constraint is available the method proceeds along the YES path to 129 to select and implement the constraint, and then on to 105 to identify new candidate input sets n1 and n2 and begin the process again. Constraints are pairs of valuations over uncorrelated inputs of n1 and n2 (call these valuations v1 and v2, where, for example, the last such valuation from the proceeding example would be v1=100 and v2=--1) which are to be precluded for a subsequent equivalence check. The process of implementing such constraints in a preferred embodiment consists of creating a logic representation of v1 and v2, particularly for the expression "NOT v1 OR NOT v2". The logical expression for each v1 and v2 consists of an AND over each input whose value was 1, as well as over the inverse (NOT) of each input whose value was 0, disregarding inputs which are unassigned. If no inputs are assigned in either v1 or v2, a CONSTANT_ONE expression is used. In some embodiments the system may be configured to select the same candidate input sets n1 and n2 as before in 105, and instead make other adjustments to the analysis routine or just an attempt another equivalence check given the newly added constraints. Returning to block 127, if no constraint is available the method proceeds from 127 along the NO path to 131 and ends. Returning to block 125, if it is determined in 125 to proceed by using a different equivalence test technique the method proceeds from 125 along the Diff't Equiv Technique branch to 123 to select a different technique for determining equivalence. (This is done only if a different equivalence technique or modification to the equivalence verification procedures is available). Upon adjusting the technique for checking equivalence the method proceeds from 123 to 105 to make adjustments to selected input sets n1 and n2 (if desired), and then check for equivalence.

The various embodiments of the method depicted in FIG. 1 may be implemented in a number of different manners, depending upon the particular requirements and capabilities at hand. For example, some of the validation checks can be done on the fly as mismatches are identified (e.g., after the YES branch from block 117), rather than waiting until near the end of the process (e.g., block 113). In a portion of the various embodiments some reachability checks are performed as mismatch traces are obtained and as constraints are added, versus performing all of these checks only after the run is complete. For example, as a constraint of the form "v1 implies not v2" is added, we immediately check whether v1 is still reachable. If not, we may terminate that check prematurely since the desired trace-containment check will not be valid. However, if v1 is determined to be reachable in this example, we still need to check related cross-products. In such embodiments this more comprehensive check is performed only after all mismatches are obtained.

Another variation of the embodiments disclosed herein involves a more efficient approach for processing the input variables through the reachability checks. Rather than attempting a brute-force combination of all clauses, we have developed a more efficient algorithm for performing this enumeration. We first label each uncorrelated input with an index 1, 2, . . . k. Two lists are kept with each index: one representing clauses which have the corresponding input in the positive polarity (evaluating to 1) and the other to the negative polarity (evaluating to 0). We maintain a top-level iterator which considers each clause in turn. For the current clause, we snapshot its valuations and pass the corresponding set of valuations to a recursive function which iterates over all indices which are not present in either polarity on the current set. We then consider each clause over the missing indices (in both polarities). For those which do not contradict the current set of valuations, we iteratively add them one by one to the current set of valuations and recurse on this function. As an additional optimization, if any input appears only with a single polarity across all clauses, we may merely add that variable in the corresponding polarity to all reachability checks, and eliminate the clause list associated with that variable. Upon completing the searching of all indices, we check if the resulting set of valuations is unique (not already passed), and if so, we add a reachability check of the current set of valuations.

Figure 2A:
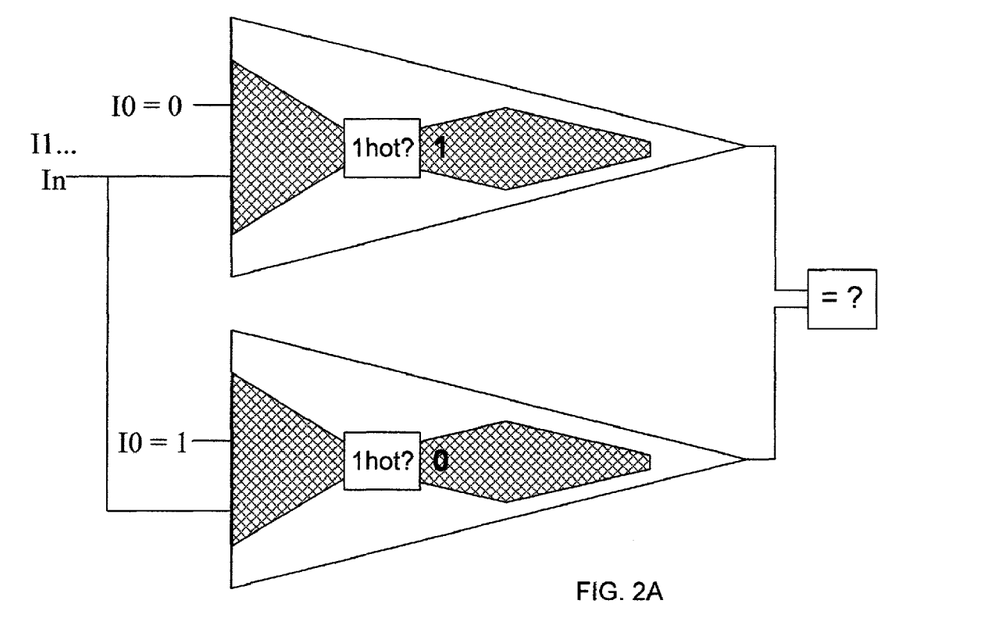
FIGS. 2A-2D depict exemplary circuitry for which relationships are sought to be developed according to various embodiments of the invention.

FIGS. 2A-2D depict exemplary circuitry for which relationships are sought to be developed according to various embodiments of the invention. FIG. 2A depicts exemplary circuitry for cofactor-based equivalence checking. A common technique used to assess whether two designs are functionally equivalent is to perform an equivalence check between them, first correlating all inputs by merging the corresponding inputs across two designs, then checking if the output of the designs are equivalent. According to one way of simplifying a design by merging inputs, one may merge that input and assess whether the result is equivalent to the original circuit. (This would correlate to only tying one input in either the top or bottom circuit in FIG. 2A to a constant, and leaving the other as a free yet uncorrelated input.) If the two designs are determined to be equivalent, the input-merged netlist may be used in place of the original netlist for purposes such as verification. We note that the simplified netlists will trivially be equivalent to the original if the input being merged (say to constant 0) in the simplified netlist is compared against the original netlist while driving the same constant (here 0) to that input. Without loss of generality, we may drive the opposite constant to the input of the corresponding circuit when performing the equivalence check, for example, as depicted in FIG. 2A.

Figure 2B:
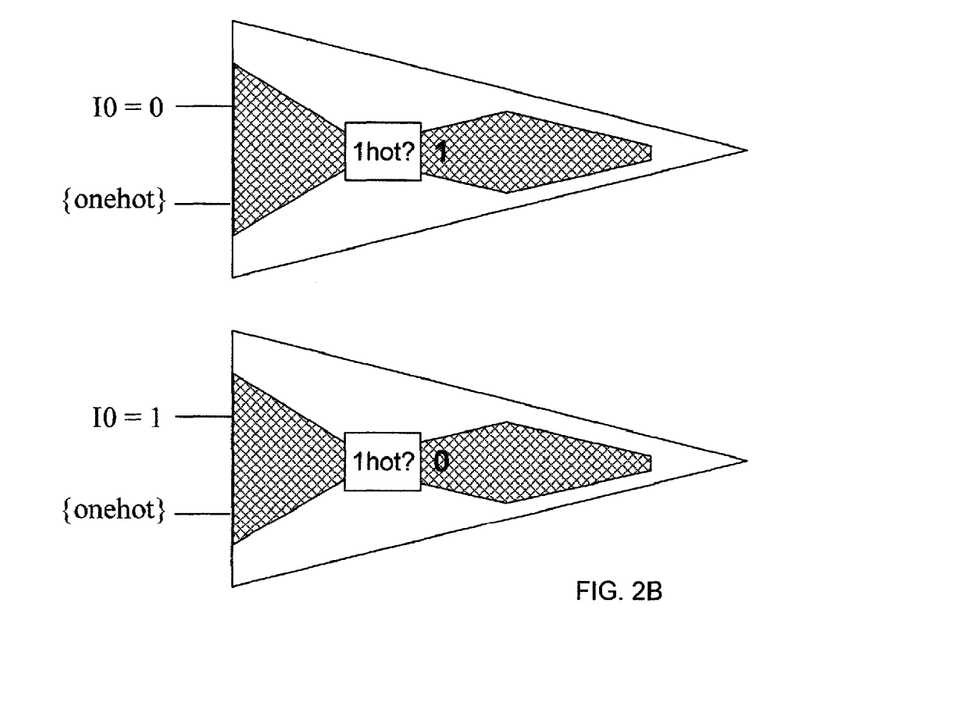

FIG. 2B depicts circuitry for a simple motivating example for the trace-equivalence based reductions proposed according to various embodiments. In particular, FIG. 2B pertains to a netlist which includes an input vector which is decoded through a one-hot detector. This example involves simplifying the netlist for enhanced verification by tying input I0 to a constant. As depicted in FIG. 2B, we may attempt to assess the behavior of this netlist with I0 driven to 0 (at the top of the figure), then check to see if the result is identical to the original circuit as depicted at the bottom of the figure. However, if the original circuit drives 1 to I0, and the other bits of the input vector take a one-hot value, we see that the one-hot detector (gate "1hot?") will differ in the produced value. In particular, the top copy of the netlist with I0=0 will have its "1hot?" gate drive to 1. The bottom copy which is free to drive I0=1 will have its "1hot?" gate drive 0. Hence, the circuits are not equivalent in this configuration.

Figure 2C:
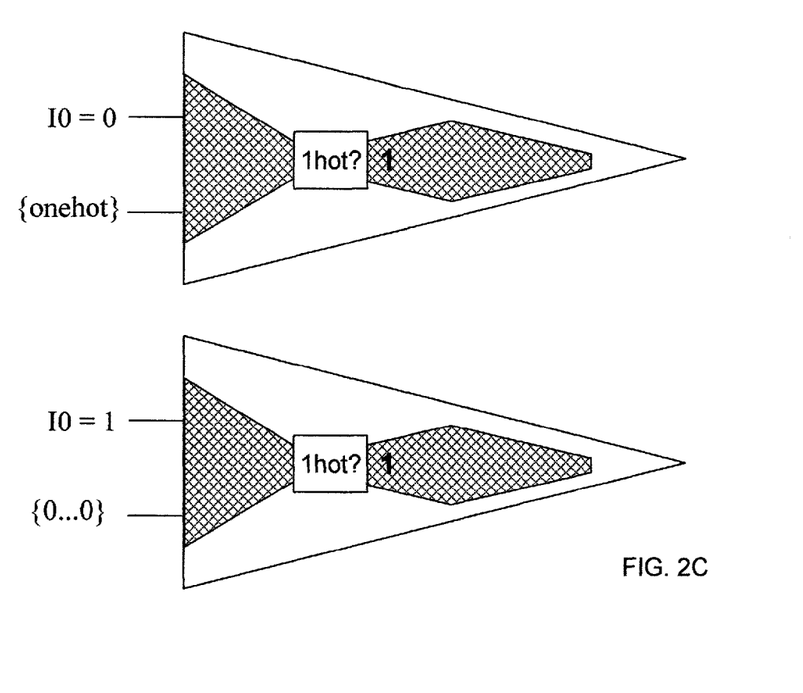

FIG. 2C depicts a different configuration of the circuitry in which the inputs are uncorrelated with a constraint added, in an effort to achieve equivalency. In this configuration if we uncorrelate specific inputs across the two designs, and constrain the values producible across those two inputs (e.g., input of {0 . . . 0} to the bottom design), equivalence may be established at the "1hot?" gate. In other words, in the configuration of FIG. 2C an arbitrary one-hot pattern is driven to the inputs other than I0 on the top netlist, and all 0s are driven to those inputs in the bottom netlist. With this arrangement the "1hot?" gate now evaluates to 1.

Figure 2D:
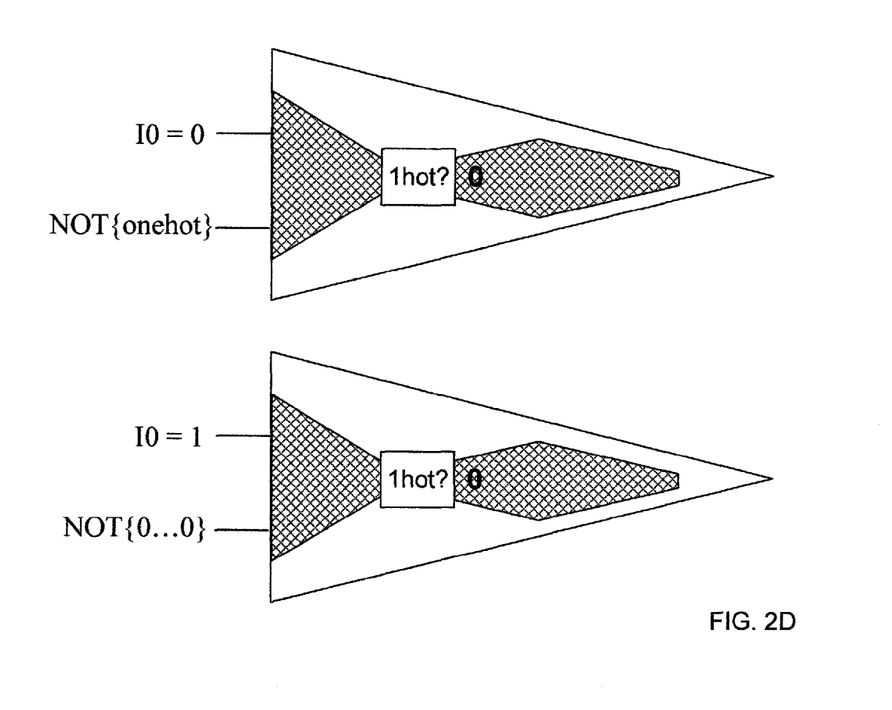

FIG. 2D depicts yet another configuration of the circuitry aimed at achieving equivalency. Note that if non-onehot values are applied to the inputs on the top netlist, and non zero values are applied to the inputs of the bottom netlist, then both netlists will drive 0 to the "1hot?" gate as depicted in FIG. 2D. Note that the analysis performed across FIGS. 2C-D may be considered, in a sense, complete, since all possible input vectors are considered across the top and bottom netlists. This example has effectively used a case splitting strategy to partition the analysis such that the "1hot?" gate evaluates the same within each case. Thus, it is safe to merge I0 to 0 and use the simplified netlist for enhanced verification.

The above example illustrates a simple case of a one-hot detector which enables us, through the mechanism disclosed herein, to merge all but one of the input vector bits through un-correlation and constraint-based manipulation of the other bite. Doing this enables equivalence checking in an effort to detect trace containment. However, this technique also works well for designs with arbitrary decoded vectors, including verification testbenches which check data-routing correctness. The various embodiments of the present invention are of substantial practical value since algorithms for equivalence checking have become fairly sophisticated. In contrast, there are no practically effective techniques for trace-containment detection, which as per the above is very useful for applications such as enabling reductions beyond those possible with equivalence checking alone.

Various embodiments of the present invention may be implemented in a number of manners. One such implantation may be represented by the following pseudo-code:

---

Boolean Check_Trace_Contained pseudo-code:

```
boolean Check_Trace_Contained(Netlist N1, Netlist N2) {
//   first check it N2 trace contains N1
mismatch_traces = Enumerate_Mismatches(N1, N2);
while(1) {
   uncorrelated_inputs = Compute_Uncorrelated_Inputs (N1, N2,
mismatch_traces);
      constraints = Compute_Constraints(N1, N2, uncorrelated_inputs,
mismatch_traces);
      result = Check_Contained(N1, N2, uncorrelated_inputs, constraints,
(new_mismatches, mismatch_traces));
      if (NOT new_mismatches) (break;}
   }
   if(result) {
      if (Validate_Constraints (N1, uncorrelated_inputs, constraints))
      return N2;
      if (Validate_Constraints (N2, uncorrelated_inputs, constraints))
      return N1;
   }
//   both checks failed
   return false;
}
```

---

In the above pseudo-code the function labeled Enumerate Mismatches( ) uses an arbitrary mechanism to obtain a set of mismatch traces over the two netlists. As discussed above, at least some of the various embodiments use a procedure that generates minimally-assigned traces, e.g., using circuit-SAT to analyze the behavior of the two designs. Alternatively, a post-processing mechanism may be employed which eliminates unnecessary input assignments, e.g. by checking whether the mismatch trace still illustrates a mismatch if the valuation at a given input is inverted and if so, to eliminate that input. The function labeled Compute_UncorrelatedInputs( ) in the above pseudo-code enumerates those inputs (or a subset thereof) which are by necessity assigned in mismatch_traces.

The function labeled Check_Contained( ) in the above pseudo-code performs an equivalence check across N1 and N2, correlating all inputs other than uncorrelated_inputs. The Check_Contained( ) function also adds the constraints over uncorrelated inputs which were derived in Compute_Constraints( ). If this procedure obtains a new mismatch trace (reported in new_mismatches, a Boolean variable indicating that a new mismatch occurs and mismatch_traces will be added), the process will repeat the loop over Compute_Uncorrelated_Inputs, Compute_Constraints, and Check_Contained to process those new mismatch traces. Typically, this loop repeats until no new mismatches are encountered. Arbitrary termination criteria may be used, however, such as user-specified time-limits or limits on the maximum number of constraints or iterations as will be discussed below. Once it finishes, if the result of Check_Contained appears that trace-containment has been successful, we perform Validate_Constraints( ) to see if the constraints are contradictory. This check is performed in two "directions." First it is checked whether all valuations to N1, given the constraints, are reachable. If so, this means that N2 trace-contains N1, hence this fact is returned. If not, we check whether all valuations to N2 are reachable given the constraints. If so, this means that N1 trace-contains N2, hence this fact is returned. Otherwise, no trace containment was detected and the process returns unsuccessfully.

Another aspect of the various embodiments involves ways to deal with limited resources, in particular, limited computational resources. At least some embodiments impose computational resource limitations on the check routines, e.g., time or memory limits, or in some instances, limits to particular functions or routines such as limits on the number of mismatch_traces or uncorrelated_inputs. Such limitations are straight forward to incorporate into the overall algorithm. If a resource limit prevents the termination of Check_Contained, for example, the result will be false hence the process will not indicate that the designs were trace contained. This may be implemented with software, for example, having logic similar to the following pseudo-code:

| Boolean Validate_Constraints pseudo-code: |
|---|
| Boolean Validate_Constraints (Netlist N, Input_List uncorrelated_inputs, Constraints Added_Constraints) {<br>    Label_Inputs (uncorrelated_inputs);<br>    for each enumerated "clause" from "Added_Constraints" {<br>        for each input label "i" {<br>            if (input "i" appears in "clause" with positive polarity)<br>                add "'clause" to Clauses_Positive [i]<br>            }<br>            else if (input "i" appears in "clause" with negative polarity) {<br>                add "clause" to Clauses_Negative [i]<br>            }<br>        }<br>    }<br>    unate_variables = {empty};<br>    for each input label "i" { |

| Boolean Validate_Constraints pseudo-code: |
|---|
|         if(Clauses_Positiveli] is empty and<br>            Clauses_Negative [i] is not empty) {<br>            add the inverse of "i" to unate_variables;<br>            empty Clauses_Negative [i];<br>        }<br>        else if(Clauses_Positive[i] is not empty and<br>            Clauses_Negative [i] is empty) {<br>            add "i" to unate_variables;<br>            empty Clauses_Positive [i];<br>        }<br>    }<br>    hash_table = {empty};<br>    for each enumerated "clause" from "Added_Constraints" {<br>        current_set = unate_variables + clause;<br>        Enumerate_Checks (current_set, Clauses_Positive,<br>        Clauses_Negative,<br>        hash_table);<br>    }<br>    if(Check_Constraints(N, hash)) {<br>        return true;<br>    }<br>    return false;<br>}<br>void Enumerate_Checks (Input_List current_set,<br>Clause_List Clauses_Positive,<br>Clause_List Clauses_Negative) {<br>    chosen_set = {empty};<br>    missing = Uncorrelated_inputs – current_set;<br>    for each "i" in missing {<br>        for each clause in Clauses_Positive [i] {<br>            if (clause is not in chosen_set and<br>                clause is compatible with current_set) {<br>                new_set = current_set + clause;<br>                add clause to chosen_set;<br>                Enumerate_Checks (new_set, Clauses_Positive,<br>                Clauses_Negative);<br>            }<br>        }<br>        for each clause in Clauses_Negative [i] {<br>            if (clause is not in chosen_set and<br>                clause is compatible with current_set) {<br>                new_set = current_set + clause;<br>                add clause to chosen_set;<br>                Enumerate_Checks(new_set, Clauses_Positive,<br>                Clauses_Negative);<br>            }<br>        }<br>    }<br>    Add_check(hash_table, current_set);<br>} |

In the above pseudo-code the function Procedure validate_Constraints( ) is used to enumerate all necessary reachability checks to ensure that the trace-containment check is valid. It constructs lists Clauses_Negative and Clauses_Positive which enumerate which clauses have input label "i" in the negative and positive polarity, respectively. A variable which appears only in one polarity across all clauses is enumerated in set unate_variables. We next call Enumerate_Checks( ) with unate_variables coupled with each clause from AddedConstraints. The function Enumerate_Checks( ), in turn, tries the compatible cross-products with the passed current_set. Each cross-product is added to a hash table by Add_Check. Finally, the Check_Constraints( ) function calls an arbitrary verification procedure to ensure that each element in the hash table is reachable. If all elements are determined to be reachable, the Check_Constraints( ) procedure will return true, indicating to Check_Trace_Contained( ) that trace-containment has been detected.

Figure 3:
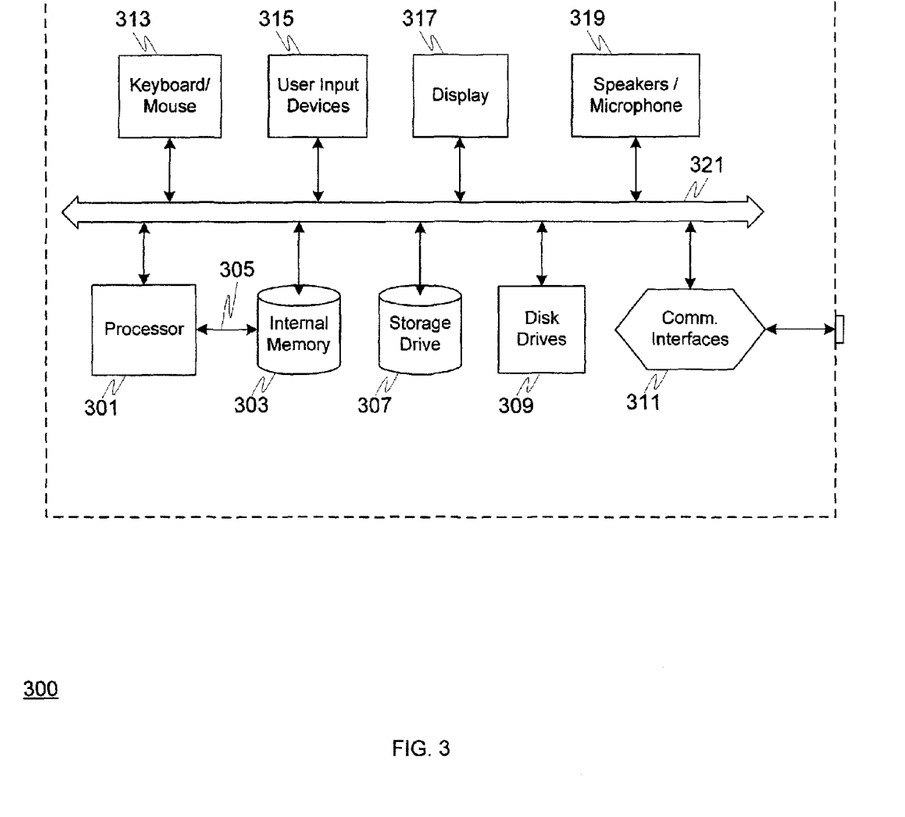
FIG. 3 depicts a computer system 300 suitable for implementing and practicing various exemplary embodiments.

FIG. 3 depicts an exemplary computer system 300 suitable for implementing and practicing various exemplary embodiments. The computer system 300 may be configured in the form of a desktop computer, a laptop computer, a mainframe computer, or any other arrangements capable of being programmed or configured to carry out instructions. The computer system 300 may be located and interconnected in one location, or may be distributed in various locations and interconnected via a local or wide area network (LAN or WAN), via the Internet, via the public switched telephone network (PSTN), or other such communication links. Other devices may also be suitable for implementing or practicing the embodiments, or a portion of the embodiments. Such devices include personal digital assistants (PDA), wireless handsets (e.g., a cellular telephone or pager), and other such consumer electronic devices preferably capable of being programmed to carry out instructions or routines.

Typically, a computer system 300 includes a processor 301 which may be embodied as a microprocessor or central processing unit (CPU). The processor 301 is typically configured to access an internal memory 303 via a bus such as the system bus 321. The internal memory 303 may include one or more of random access memory (RAM), read-only memory (ROM), cache memory, or a combination of these or other like types of circuitry configured to store information in a retrievable format. In some implementations the internal memory 303 may be configured as part of the processor 301, or alternatively, may be configured separate from it but within the same packaging. The processor 311 may be able to access internal memory 303 via a different bus or control lines (e.g., local bus 305) than is used to access the other components of computer system 300.

The computer system 300 also typically includes, or has access to, one or more storage drives 307 (or other types of storage memory) and floppy disk drives 309. Storage drives 307 and the floppy disks for floppy disk drives 309 are examples of machine readable mediums suitable for storing the final or interim results of the various embodiments. The storage drive 307 is often a hard disk drive configured for the storage and retrieval of data, computer programs or other information. The storage drive 307 need not necessarily be contained within the computer system 300. For example, in some embodiments the storage drive 307 may be server storage space within a network or the Internet that is accessible to the computer system 300 for the storage and retrieval of data, computer programs or other information. For example, the computer system 300 may use storage space at a server storage farm accessible by the Internet 350 or other communications lines. The floppy disk drives 309 may include a combination of several disc drives of various formats that can read and/or write to removable storage media (e.g., CD-R, CD-RW, DVD, DVD-R, floppy disk, etc.). The computer system 300 may either include the storage drives 307 and floppy disk drives 309 as part of its architecture (e.g., within the same cabinet or enclosure and/or using the same power supply), as connected peripherals, or may access the storage drives 307 and floppy disk drives 309 over a network, or a combination of these. The storage drive 307 is often used to store the software, instructions and programs executed by the computer system 300, including for example, all or parts of the computer application program for carrying out the various embodiments.

The computer system 300 may include communication interfaces 311 configured to be communicatively connected to the Internet, a local area network (LAN), a wide area network (WAN), or connect with other devices using protocols such as the Universal Serial Bus (USB), the High Performance Serial Bus IEEE-1394 and/or the high speed serial port (RS-232). The computers system 300 may be connected to the Internet via the wireless router 301 (or a wired router or other node—not shown) rather than have a direct connected to the Internet. The components of computer system 300 may be interconnected by a bus 321 and/or may include expansion slots conforming to any of various industry standards such as PCI (Peripheral Component Interconnect), ISA (Industry Standard Architecture), or EISA (enhanced ISA).

Typically, the computer system 300 includes one or more user input/output devices such as a keyboard and/or mouse 313, or other means of controlling the cursor (e.g., touchscreen, touchpad, joystick, trackball, etc.) represented by the user input devices 315. The communication interfaces 311, keyboard and mouse 313 and user input devices 315 may be used in various combinations, or separately, as means for receiving information and other inputs to be used in carrying out various programs and calculations. A display 317 is also generally included as part of the computer system 300. The display may be any of several types of displays, including a liquid crystal display (LCD), a cathode ray tube (CRT) monitor, a thin film transistor (TFT) array, or other type of display suitable for displaying information for the user. The display 317 may include one or more light emitting diode (LED) indicator lights, or other such display devices. In addition, most computer systems 300 also include, or are connected to, one or more speakers and microphones 319 for audio output and input. Speech recognition software may be used in conjunction with the microphones 319 to receive and interpret user speech commands.

The invention may be implemented with any sort of processing units, processors and controllers capable of performing the stated functions and activities. For example, the processor 301 (or other processors used to implement the embodiments) may be a microprocessor, microcontroller, DSP, RISC processor, or any other type of processor that one of ordinary skill would recognize as being capable of performing the functions or activities described herein. A processing unit in accordance with at least one exemplary embodiment can operate computer software programs stored (embodied) on a computer-readable medium such as the internal memory 303, the storage drive 307, or other type of machine-readable medium, including for example, floppy disks, optical disks, a hard disk, CD, flash memory, ram, or other type of machine readable medium as recognized by those of ordinary skill in the art. The computer system 300 is configured to receive the design or other netlist information for the integrated circuit (IC) or other circuitry or to be analyzed and store the information in a computer-readable medium such as the internal memory 303, the storage drive 307, or other type of machine-readable medium. The computer system 300 is configured to modify the design by loading and executing instructions that operate on the netlist information. Upon completing modifications to the design the computer system 300 is configured to provide the modified design information, e.g., by storing it on a computer readable medium, in a format suitable for fabricating the IC design.

Computer software programs and instructions can be used to aid or perform the steps and activities described above. For example computer programs in accordance with at least one exemplary embodiment may include: source code for obtaining candidate input sets i1 and i2 of the netlists n1 and n2; source code for uncorrelating the input set i1 from the input set i2; source code for checking equivalence of the netlists n1 and n2 to identify trace-containment; source code for identifying a mismatch between the netlists n1 and n2; source code for imposing at least one constraint to avoid said mismatch; and source code for validating a relationship of equivalency of the netlists n1 and n2. There are many further source codes that may be written to perform the stated steps and procedures above, and these are intended to lie within the scope of exemplary embodiments.

Various activities may be included or excluded as described above, or performed in a different order, with the rest of the activities still remaining within the scope of at least one exemplary embodiment. For example, in some embodiments block 113 may be omitted so that there is no validation performed at the end of the procedure. Instead, the validation of relationships can be performed on the fly as each relationship is identified, or at interim points for several relationships. In another alternative embodiment the candidate input sets are identified once in block 105, and these input sets continue to be processed until the method ends. In such embodiments blocks 123 and 129 loop back to the equivalence check block 109 to continue with the same pair of input sets n1 and n2, instead of back to 105 to select new input sets.

State holding elements, sometimes called state devices or state elements, are discussed above in terms of being implemented as registers or gates. However, in some embodiments any sort of state holding element may be used to implement various embodiments, including for example, registers, latches, state machines, or the like. For the purposes of illustrating and explaining the invention the terms variable, gate and register have been used interchangeably throughout this disclosure.

The use of the word "exemplary" in this disclosure is intended to mean that the embodiment or element so described serves as an example, instance, or illustration, and is not necessarily to be construed as preferred or advantageous over other embodiments or elements. The description of the various exemplary embodiments provided above is illustrative in nature and is not intended to limit the invention, its application, or uses. Thus, variations that do not depart from the gist of the invention are intended to be within the scope of the embodiments of the present invention. Such variations are not to be regarded as a departure from the spirit and scope of the present invention.

What is claimed is:

1. A method, performed by execution of instructions loaded into a computer system, of identifying trace-containment over sequential circuitry design netlists n1 and n2 by using constraint-based uncorrelated equivalence checking, the method comprising:
   obtaining, by the execution of said instructions, candidate input sets i1 and i2 of the netlists n1 and n2;
   uncorrelating, by the execution of said instructions, the input set it from the input set i2 wherein the uncorrelating allows the input set i1 and the input set i1 to be independently manipulated;
   checking equivalence of the netlists n1 and n2 by the execution of said instructions to identify trace-containment;
   identifying, by the execution of said instructions, a mismatch between the netlists n1 and n2; and
   imposing, by the execution of said instructions, at least one constraint to avoid said mismatch;
   wherein said at least one constraint avoids said mismatch by artificially limiting a stimulus that can be applied in checking equivalence between the netlist n1 and the netlist n2 using uncorrelated inputs of the input sets i1 and i2;
   wherein the netlist n2 is a simplified version of, or alternate implementation of, the netlist n1; and
   wherein a relationship of equivalence of the netlists n1 and n2 is validated after imposing the at least one constraint to preclude said identified mismatch.

2. The method of claim 1, further comprising:
   validating, by the execution of said instructions, a relationship of equivalency of the netlists n1 and n2.

3. The method of claim 2, wherein said at least one constraint are one or more input constraints imposed in response to said identified mismatch.

4. The method of claim 1, wherein the netlist n2 is a first simplified version of, or alternate implementation of, the netlist n1.

5. The method of claim 4, further comprising:
   in response to demonstrated equivalence between the netlists n1 and n2, using the netlist n2 to produce a second simplified version of the netlist n1.

6. The method of claim 4, wherein the at least one constraint used to establish equivalence between the netlists n1 and n2 is used to produce the first simplified version of the sequential circuitry design netlist n1.

7. The method of claim 1, wherein mismatch is identified from results of said checking equivalence of the netlists n1 and n2.

8. A software product comprising a program of instructions stored on a machine readable device for identifying trace-containment over sequential circuitry design netlists n1 and n2 by using constraint-based uncorrelated equivalence checking, wherein the program of instructions upon being executed on a computer causes the computer to perform activities comprising:
   obtaining, by the execution of said instructions, candidate input sets i1 and i2 of the netlists n1 and n2;
   uncorrelating, by the execution of said instructions, the input set i1 from the input set i2 wherein the uncorrelating allows the input set i1 and the input set i1 to be independently manipulated;
   checking equivalence of the netlists n1 and n2 by the execution of said instructions to identify trace-containment;
   identifying, by the execution of said instructions, a mismatch between the netlists n1 and n2; and
   imposing, by the execution of said instructions, at least one constraint to avoid said mismatch;
   wherein said at least one constraint avoids said mismatch by artificially limiting a stimulus that can be applied in checking equivalence between the netlist n1 and the netlist n2 using uncorrelated inputs of the input sets i1 and i2;
   wherein the netlist n2 is a simplified version of, or alternate implementation of, the netlist n1; and
   wherein a relationship of equivalence of the netlists n1 and n2 is validated after imposing the at least one constraint to preclude said identified mismatch.

9. The product of claim 8, the activities further comprising:
   validating, by the execution of said instructions, a relationship of equivalency of the netlists n1 and n2.

10. The product of claim 9, wherein said at least one constraint are one or more input constraints imposed in response to said identified mismatch.

11. The product of claim 8, wherein the netlist n2 is a first simplified version of, or alternate implementation of, the netlist n1.

12. The product of claim 11, the activities further comprising:
   in response to demonstrated equivalence between the netlists n1 and n2, using the netlist n2 to produce a second simplified version of the netlist n1.

13. The product of claim 11, wherein the at least one constraint used to establish equivalence between the netlists n1 and n2 is used to produce the first simplified version of the sequential circuitry design netlist n1.

14. The product of claim 8, wherein mismatch is identified from results of said checking equivalence of the netlists n1 and n2.

15. A computer system configured to execute instructions for identifying trace-containment over sequential circuitry design netlists n1 and n2 by using constraint-based uncorrelated equivalence checking, the system comprising:
- memory configured to store candidate input sets i1 and i2 of the netlists n1 and n2;
- a processor configured to execute the instructions to uncorrelate the input set i1 from the input set i2, wherein the uncorrelating allows the input set i1 and the input set i1 to be independently manipulated, said processor further being configured to execute the instructions to check equivalence of the netlists n1 and n2 to identify trace-containment; and
- a display device configured to display a mismatch identified between the netlists n1 and n2;
- wherein said processor, in response to identifying said mismatch, is further configured to execute the instructions to impose at least one input constraint configured to avoid the mismatch by precluding said identified mismatch;
- wherein said at least one constraint avoids said mismatch by artificially limiting a stimulus that can be applied in checking equivalence between the netlist n1 and the netlist n2 using uncorrelated inputs of the input sets i1 and i2;
- wherein the netlist n2 is a simplified version of, or alternate implementation of, the netlist n1; and
- wherein a relationship of equivalency of the netlists n1 and n2 is validated after imposing the at least one constraint to preclude said identified mismatch.

16. The system of claim 15, wherein said processor is further configured to execute the instructions to validate a relationship of equivalency of the netlists n1 and n2.

17. The system of claim 15, wherein said at least one constraint are one or more input constraints imposed in response to said identified mismatch.

18. The system of claim 15, wherein the netlist n2 is a first simplified version of, or alternate implementation of, the netlist n1.

19. The system of claim 18, the processor being further configured to execute the instructions to produce a second simplified version of the netlist n1 in response to demonstrated equivalence between the netlists n1 and n2, using the netlist n2.

* * * * *